United States Patent
Pavanaskar et al.

(10) Patent No.: US 10,438,407 B2
(45) Date of Patent: Oct. 8, 2019

(54) SOLID MODELER THAT PROVIDES SPATIAL GRADIENTS OF 3D CAD MODELS OF SOLID OBJECTS

(71) Applicant: Aerion Intellectual Property Management Corporation, Reno, NV (US)

(72) Inventors: Sushrut S. Pavanaskar, Castro Valley, CA (US); Bharath Mukundakrishnan, San Jose, CA (US); Raymond P. D'Antuono, El Cerrito, CA (US); Dev G. Rajnarayan, Mountain View, CA (US)

(73) Assignee: AERION INTELLECTUAL PROPERTY MANAGEMENT CORPORATION, Reno, NV (US)

( * ) Notice: Subject to any disclaimer, the term of this patent is extended or adjusted under 35 U.S.C. 154(b) by 0 days.

(21) Appl. No.: 15/946,572

(22) Filed: Apr. 5, 2018

(65) Prior Publication Data

US 2018/0293792 A1 Oct. 11, 2018

Related U.S. Application Data

(60) Provisional application No. 62/482,023, filed on Apr. 5, 2017, provisional application No. 62/482,029, filed on Apr. 5, 2017.

(51) Int. Cl.
*G06T 17/20* (2006.01)
*G06F 17/50* (2006.01)
(Continued)

(52) U.S. Cl.
CPC .......... *G06T 17/20* (2013.01); *G06F 17/5018* (2013.01); *G06T 15/04* (2013.01);
(Continued)

(58) Field of Classification Search
None
See application file for complete search history.

(56) References Cited

U.S. PATENT DOCUMENTS 9,536,022 B1 1/2017 Tertois et al.
2007/0297645 A1 12/2007 Pace
(Continued)

OTHER PUBLICATIONS

Nemec et al., "Aerodynamic Shape Optimization Using a Cartesian Adjoint Method and CAD Geometry," American Institute of Aeronautics and Astronautics Paper, pp. 2006-3456, Jul. 2006.
(Continued)

*Primary Examiner* — Yanna Wu
(74) *Attorney, Agent, or Firm* — Pillsbury Winthrop Shaw Pittman LLP

(57) ABSTRACT

This disclosure provides a method for providing spatial gradients of 3D CAD models of solid objects with respect to various parameters used in defining the solid object. A modeler is designed and implemented to provide spatial gradients of solid objects (when represented on a computer as 3D CAD models) with respect to the various parameters that define the objects. Although primarily based on finite difference operations, several additional steps are performed to ensure that the gradients computed are correct and valid for a general class of solid objects and the parameters that define the objects. No commercially available 3D CAD tool provides such ability for a general class of solid objects.

14 Claims, 4 Drawing Sheets

(51) Int. Cl.
 *G06T 15/50* (2011.01)
 *G06T 19/20* (2011.01)
 *G06T 15/04* (2011.01)
(52) U.S. Cl.
 CPC .............. *G06T 15/50* (2013.01); *G06T 19/20* (2013.01); *G06F 17/50* (2013.01)

(56) References Cited

U.S. PATENT DOCUMENTS

2009/0136103 A1    5/2009   Sonka et al.
2015/0142394 A1*   5/2015   Mehr ..................... G06F 17/50
                                                                               703/1
2018/0067229 A1*   3/2018   Li ............................ G01V 1/282

OTHER PUBLICATIONS

Truong, Ah, "Surface Mesh Movement Algorithm for CAD-Based Aerodynamic Shape Optimization," AIAA Journal, vol. 54, Issue 2, Jan. 7, 2016, 37 pages.
International Search Report and Written Opinion dated Jun. 20, 2018, for PCT Application No. PCT/US18/26316.

* cited by examiner

SOLID MODELER THAT PROVIDES SPATIAL GRADIENTS OF 3D CAD MODELS OF SOLID OBJECTS

RELATED APPLICATION

This application hereby claims the benefit of and priority to U.S. Provisional Patent Application No. 62/482,023, filed Apr. 5, 2017, and to U.S. Provisional Patent Application No. 62/482,029, also filed Apr. 5, 2017, both of which are hereby incorporated by reference in their entirety.

FIELD OF TECHNOLOGY

This disclosure relates to 3D CAD models of solid objects.

BACKGROUND

Spatial gradients are necessary in many scientific methods including in gradient-based optimizations. Prior art suggests two primary approaches of analytical and finite-difference based gradient computations in 3D solid modeling. An analytical approach, although more accurate, is not sufficiently scalable and may not be even possible for some solid modeling operations (such as Booleans) performed when creating 3D CAD models for solids. Finite difference based gradient computation, on the other hand, first correlates two states (original and 'changed' due to a change in a defining parameter value of the model) of a 3D CAD model and computes the spatial difference between them at several points on the model surfaces.

SUMMARY

This disclosure provides a method for providing spatial gradients of 3D CAD models of solid objects with respect to various parameters used in defining the solid object. A modeler is designed and implemented to provide spatial gradients of solid objects (when represented on a computer as 3D CAD models) with respect to the various parameters that define the objects. Although primarily based on finite difference operations, several additional steps are performed to ensure that the gradients computed are correct and valid for a general class of solid objects and the parameters that define the objects. No commercially available 3D CAD tool provides such ability for a general class of solid objects.

This disclosure describes a method to compute spatial gradients with respect to a defining parameter for any arbitrary solid when represented as a faceted 3D CAD model. A vector finite difference operation is used as a basis and a surface parameterization based scheme is used to correlate the nominal and the perturbed model. Along with careful handling of corner cases where parametric surface definitions are unreliable, several checks are performed before and after computing the finite difference to ensure validity of the gradients.

Specifically, this disclosure describes systems and methods for improving reliability in designing an arbitrarily shaped object based on three-dimensional (3D) solid modeling of the object, the method comprising: obtaining a nominal model of the object; computing a surface mesh of the object; recording characteristics of a plurality of mesh nodes, including parametric coordinates and originating surfaces of each mesh node, and whether a particular mesh node lies on a surface boundary; obtaining a perturbed model of the object with at least one parameter of the object changed with respect to the nominal model; using the perturbed model, computing spatial positions of the plurality of mesh nodes by repeatedly querying corresponding spline surfaces of the perturbed model to obtain updated parametric coordinates of the plurality of mesh nodes; computing gradients at the plurality of mesh nodes by computing a vector at each mesh node that represents the difference between the previously recorded parametric coordinates of that mesh node and the updated parametric coordinates of that mesh node; reporting the computed gradients for the plurality of mesh nodes; detecting if any of the reported computed gradients is significantly smaller than the rest of the computed gradients, indicating a spurious movement of the corresponding mesh node; and, removing the computed gradients indicating spurious movement of certain mesh nodes among the plurality of mesh nodes to improve reliability of further design optimization of the object.

Physical solid objects created based on the results of the 3D CAD model disclosed herein can be used for various applications, including but not limited to aircraft shape optimization in the aerospace industry and governmental space programs.

BRIEF DESCRIPTION OF THE DRAWINGS

The following description and associated figures teach illustrative embodiments of the disclosure. For the purpose of teaching inventive principles, some conventional aspects of the illustrative examples can be simplified or omitted. The claims should be considered as part of the disclosure. Note that some aspects of the best mode may not fall within the scope of the disclosure as specified by the claims. Thus, those skilled in the art will appreciate variations from the claimed embodiments that fall within the scope of the disclosure. Those skilled in the art will appreciate that the features described below can be combined in various ways to form multiple variations of the disclosure. As a result, the disclosure is not limited to the specific examples described below.

Please note that in the figures, relative geometrical dimensions are not necessarily shown to scale.

DETAILED DESCRIPTION

Figure 1:
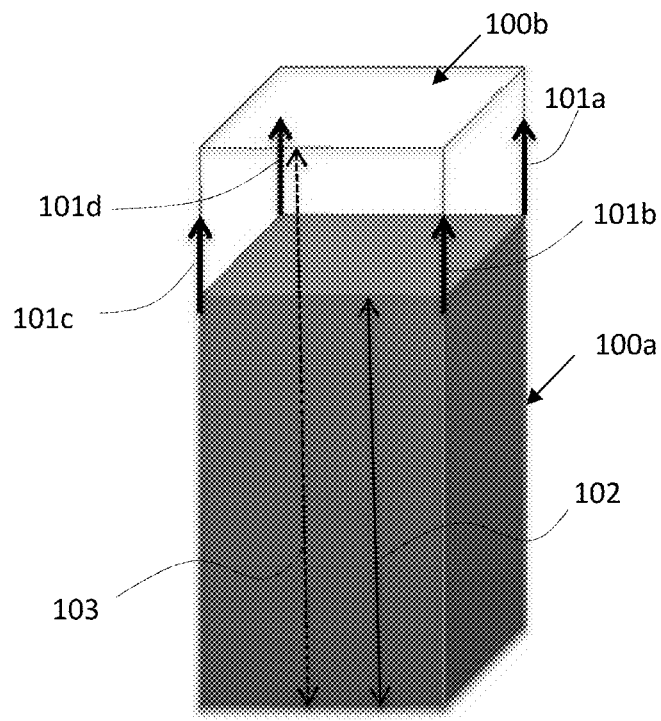
FIG. 1 shows an example of a solid rectangular object whose gradients at the top four corners are represented by vectors.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Aspects of the disclosure can be implemented in any convenient form. For example, an embodiment may be implemented by one or more appropriate computer programs which may be carried on an appropriate tangible carrier medium. Embodiments of the disclosure may be implemented using suitable apparatus which may specifically take the form of a programmable computer running a computer program arranged to implement a method as described herein.

The present disclosure refers to 3D CAD models, spatial gradient, iterative shape optimization methods.

3D CAD models are computer representations of three-dimensional solid objects in the real world (ranging from a pen to an airplane). 3D CAD models are used for a variety of purposes using analysis, simulation, 3D printing, etc. An object can be represented in multiple ways hence there are many types of 3D CAD models. For example, an object can be represented by various surfaces "sewn" together. In such a representation, a solid cube is represented by its 6 surfaces (4 sides, top, and bottom). In turn, each surface is then represented on the computer via suitable means such as defining its limiting boundaries (called edges). For each surface of the cube, there are 4 boundaries/edges that are straight lines. Finally, the boundaries (edges) themselves are represented/defined by end points and type (straight, circular curve, spline curve, etc.). Thus, for boundaries of the 6 surfaces that define the cube, each boundary is a straight type boundary between two points that are each defined in 3-dimensions. Alternatively, an object can be represented by the space it occupies in three dimensions made up of unit 3D blocks called voxels. In such a representation, the same cube can be represented as an object encompassing all the voxels that lie inside its volume.

In mathematics, the gradient is a generalization of the usual concept of derivative to functions of several variables. If $f(x_1, \ldots, x_n)$ is a differentiable, real-valued function of several variables, its gradient is the vector whose components are the 'n' partial derivatives of the function 'f'. Similarly to the usual derivative, the gradient represents the slope of the tangent of the graph of the function. More precisely, the gradient points in the direction of the greatest rate of increase of the function, and its magnitude is the slope of the graph in that direction. Spatial gradients are gradients of 3D positions in space. For a 3D model, spatial gradients are computed as changes in the object (with respect to a function/parameter that changes the object) calculated at various positions on the object.

This application refers to such spatial gradients computed at several positions on a solid object's periphery/boundary and not for the positions that lie in the interior of the solid object. The solid modeling method described herein reports the spatial gradients computed at the solid object's periphery/boundary such that they can be used in design optimization methods.

In FIG. 1 an example of a gradient is represented by vectors 101a-d (shown as the thick short arrows) at four positions on the top four corners of the solid rectangular object 100a with respect to changes in its height (a defining parameter of the rectangular object). The original height of the rectangular object 100a is shown as 102. When the object 100a is elongated to object 100b, the changed height of elongated object 100b is shown as 103.

Figure 2:
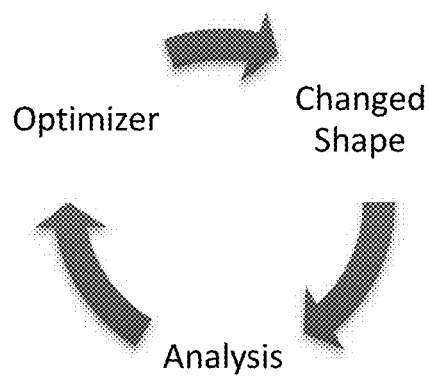
FIG. 2 shows a conceptual shape optimization loop.

Shape optimization is part of the field of optimal control theory. The typical problem is to find the shape which is optimal in that it minimizes a certain cost functional while satisfying given constraints. A computer can be used to perform shape optimization for 3D solids in an iterative fashion using algorithms termed as shape optimization algorithms. In such shape optimization methods, the cost function being minimized for a shape is calculated using an analysis/solver/function evaluation tool, the shape is changed by changing its parameters, and then evaluated again in order to minimize the cost function iteratively. Conceptual representation of such a shape optimization loop is shown in FIG. 2.

The described method to compute spatial gradients of 3D CAD models is widely applicable to any type of solids when represented by its surfaces. Such spatial gradients are necessary for some shape optimizations (such as adjoint-based optimization) commonly used in design optimization process for airplanes and airplane components. Interested readers can review, for example, an article, titled, "Aerodynamic Shape Optimization Using a Cartesian Adjoint Method and CAD Geometry," by Nemec et al. (American Institute of Aeronautics and Astronautics Paper 2006-3456, July 2006). These spatial gradients inform about how the shape being optimized (e.g. an airplane) will change (shrink/grow/warp) at various points on the solid if a particular parameter (e.g. wing sweep angle) is changed. Mathematically, the magnitude of the spatial gradient is then computed as dx (or dy or dz) over the magnitude change in a defining parameter of the shape.

As described above in the background section, no commercial or otherwise reported solid modeling method exists that computes such spatial gradients and reports them such that they can be used in further downstream design optimization methods. The disclosed modeler removes this limitation by providing a finite-difference based spatial gradient computation heavily relying on the underlying surface-based representation of 3D CAD models. The described method is agnostic to the defining parameters or their combinations thereof, resulting in spatial gradient computations with respect to simple or composite parameters.

The described modeler starts with a 3D CAD model of a solid and a query from the user asking for spatial gradients of the model with respect to a defining parameter of the solid. Optionally, the step size for finite difference calculations is also accepted. The gradients are reported at several points on the component that happen to be the nodes of a triangular surface mesh built on the surfaces of the 3D CAD model. Though the present disclosure adopts a finite-difference based gradient computation, an implementation of the embodiments described herein is a part of a solid modeler tool has been demonstrated to work with NASA's adjoint-based design framework on aircraft shape optimization problems.

Figure 3:
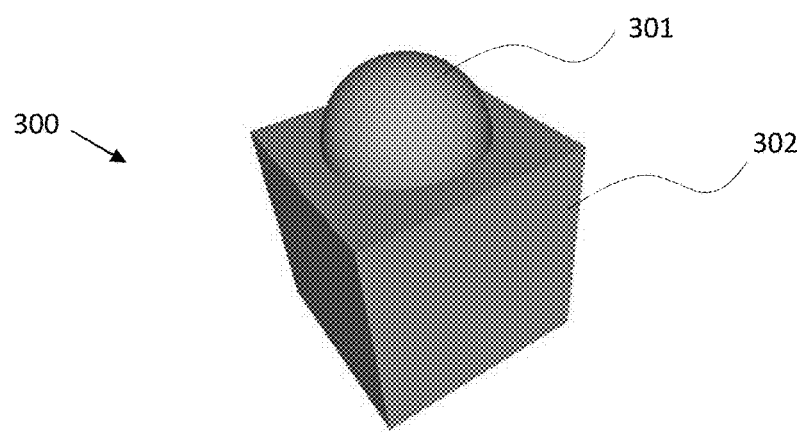
FIG. 3 shows an example of a solid composite object, comprising a hemisphere on top of a cube, in its original unchanged form.

The function of the modeler is demonstrated with reference to a solid object shown in FIG. 3. The modeler is used to compute spatial gradients with respect to a defining parameter of the solid—radius of the hemisphere on top of the cube.

As shown in FIG. 3, the input is a solid 300 with a cube 302 of side "s" and a hemisphere 301 on the top of the cube of radius "r". The 3D CAD model for this solid 300 is created using a 3D modeling kernel (e.g., ACIS). Spatial gradients of this solid 300 are computed with respect to a change in radius "r" of the hemisphere 301, without changing the cube 302. The following steps are used for the disclosed method.

Figure 4:
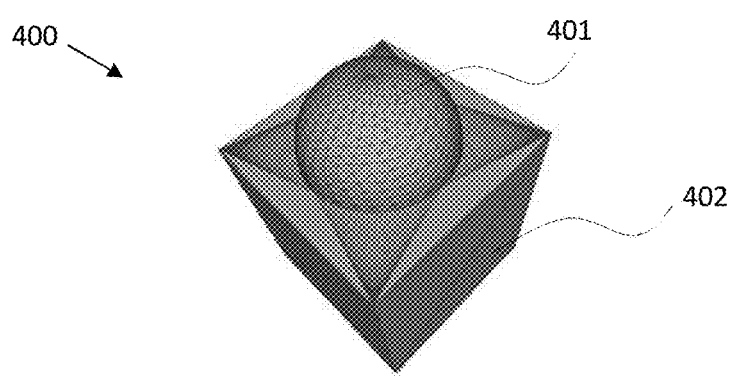
FIG. 4 shows the meshed version of the object of FIG. 3.

Step 1: Mesh the nominal solid, as shown in FIG. 4. The meshed solid 400 has a meshed cube 402 and a meshed hemisphere 401. A triangular surface mesh for the 3D CAD model is computed. While recording the mesh, the following are also recorded:

1. parametric coordinates for mesh vertices (nodes), i.e. the U,V values in surface definitions
2. originating surface for each node, and
3. whether or not a node falls on a surface boundary or "edge" in the model.

This information is stored along with the neighboring node and connectivity information for each node in a data structure specifically designed to hold a mesh.

Step 2: Obtain the 3D CAD model (but not a mesh) of the solid with the changed parameter. This is different from the existing art, where the whole surface mesh moves when the shape of the object changes. For example, see the article titled, "Surface Mesh Movement Algorithm for CAD-Based Aerodynamic Shape Optimization," by Truong, published in the AIAA Journal, vol. 54, issue 2 (Jan. 7, 2016). In the present method, the 3D CAD model is re-built with new defining parameter values provided by the user. In the example shown in FIG. 5, this means the solid object 500 is built with the changed (increased) radius R of the hemisphere 501 (i.e. hemisphere 501 has a radius a' which is greater greater than the radius 'r' of hemisphere 301). The cube 502 has no change with respect to cube 302. It is also reported to the user whether the change in parameter value is too large for accurate finite difference gradients if the newly built solid 500 has different topology than the solid 300 in Step 1 (i.e. if this solid has a different number of edges/surfaces).

Step 3: Using the new model in Step 2, compute spatial positions of original mesh nodes (recorded in Step 1) by repeatedly querying the corresponding spline surfaces of the new model for the parametric coordinates (U,Vs) of the original mesh nodes.

Step 4: Compute gradients and report them at nodes of the original model mesh by computing the vector that represents the difference between the spatial positions obtained in Step 3 and the original spatial positions of nodes in Step 1.

$$\nabla = \bar{s} = \frac{d(\text{Position})}{d(\text{Parameter})}$$

In this example, for any point on the solid, $$\nabla = \bar{s} = \left(\frac{\Delta x}{\Delta \text{rad}}, \frac{\Delta y}{\Delta \text{rad}}, \frac{\Delta z}{\Delta \text{rad}}\right)$$

Figure 6A:
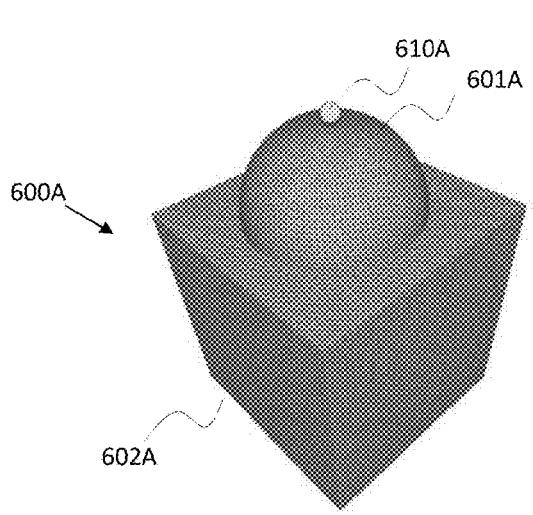
FIGS. 6A-6B, 7A-7B and 8A-8B show various nodes on a solid object and their corresponding change (or lack of change) in position due to the dimensional change, giving rise to vectors of varying amplitudes and directions.
Figure 6B:
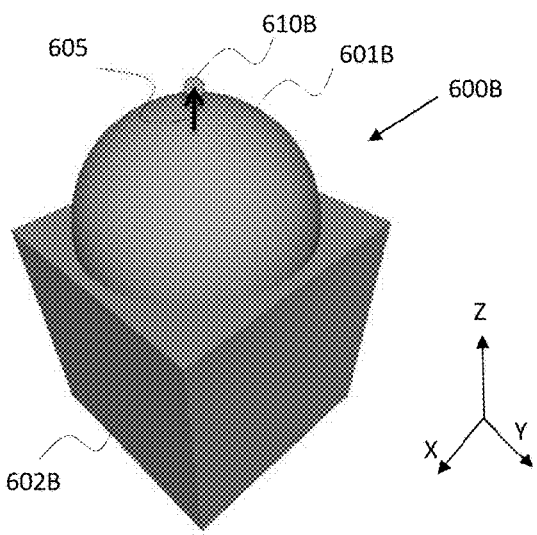
Figure 7A:
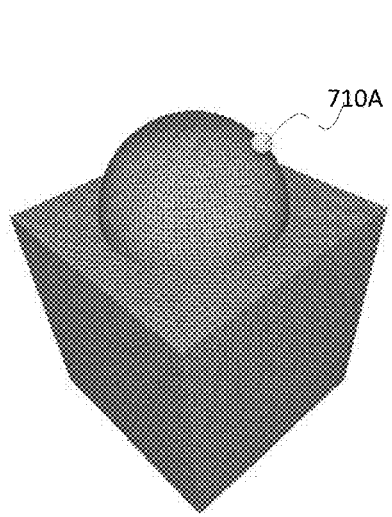
Figure 7B:
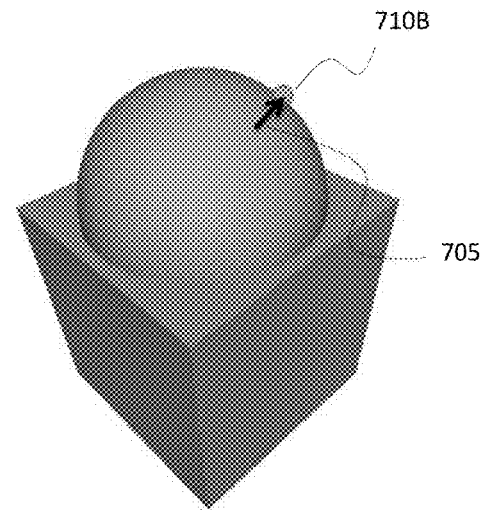
Figures 8A, 8B:
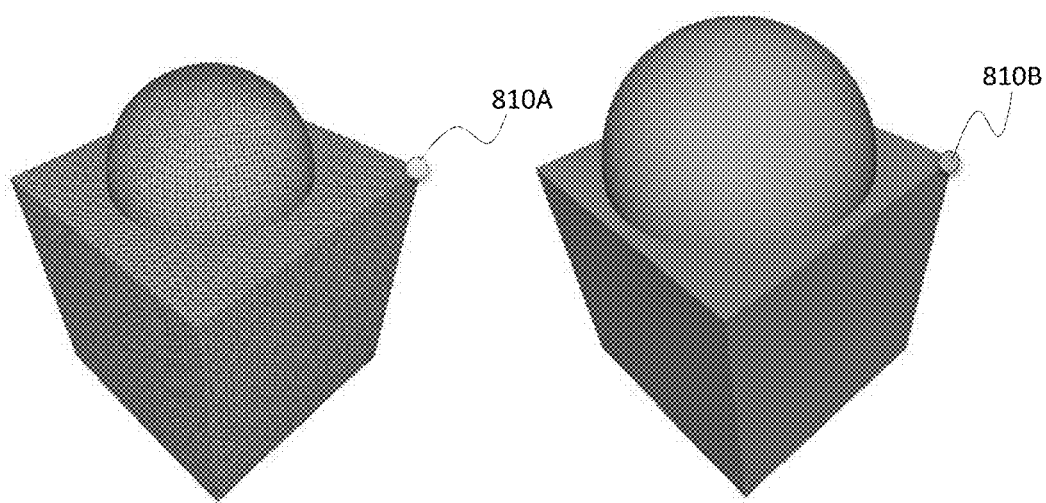

A few positions are looked at in the example to illustrate the computed gradients with respect to the increased radius. In FIGS. 6B and 7B, finite difference vectors $\bar{s}$ shown as the arrow.

a. At the top of the hemisphere: FIG. 6A shows the meshed model 600A of the original solid model with hemisphere 601A on top of cube 602A. The point 610A is on the top of the hemisphere 601A. As seen in FIG. 6B, the increase in radius of the hemisphere 601B on top of cube 602B causes the point 610B at the apex to go farther up in Z direction but not move along X or Y directions. Thus, in this case, the computed gradient is $(0,0,\delta Z_{apex}/\delta R)$.

b. A node on the hemi-sphere elsewhere: FIG. 7A shows a point 710A on the surface (but not on the top) of the hemisphere. As seen in FIG. 7B, due to the increase in the radius, the hemi-sphere is now wider and taller, causing the node to move "outwards" to position 710B. The computed gradient 705 is thus $((x'-x)/dR, (y'-y)/dR, (z'-z)/dR)$ c. A corner of the cube: FIG. 8A shows a point 810A at the corner of the cube. As seen in FIG. 8B, the cube dimensions are not changed hence the node remains in its place (i.e. position of 810A and 810B are identical) even though the radius of the hemi-sphere and hence the shape of the hemi-sphere changed. Therefore, the gradient for this node is just $(0,0,0)$.

Step 5: Post processing for validity and special cases. The following post-processing tasks are performed to ensure that the gradients that are computed are valid and correct, especially at "corner" cases.

1. For the mesh nodes of the original mesh that lie on the "edges" and the corners of the solid, such as the rim of the hemisphere on the top of the cube, the gradients are computed twice, once as if the points are a part of the cube's surface and once as if the points are a part of the hemisphere's surface. The gradient is computed as the mean of the two gradients. Such a treatment ensures that we get correct gradients for such boundary points.
2. Because spline parameterization of the surfaces is relied on, sometimes false gradients might be reported for points that don't actually move but a movement is seen due to parameterization change. Such motions are detected (they tend to be orders of magnitude smaller) and are ignored to avoid destabilizing downstream optimization algorithms such as the adjoint-based optimization.

Persons skilled in the art would appreciate that a computer system can assist in implementing the methods and flows disclosed herein. The computer system may include communication mechanisms for communicating information, and a processor (or multiple processors) for processing information. One or more of the processors may be special graphic processing unit (GPU) for executing the modeler's software components along with associated hardware.

The computer system may also include a memory, such as a random access memory (RAM) or other dynamic storage device, for storing information and instructions to be executed by the processor. The memory also may be used for storing temporary variables or other intermediate information during execution of instructions to be executed by the processor. The computer system may further include a read only memory (ROM) or other static storage device for storing static information and instructions for the processor. A storage device, such as a magnetic disk or optical disk or a solid state device, is provided for storing information and instructions.

Figure 5:
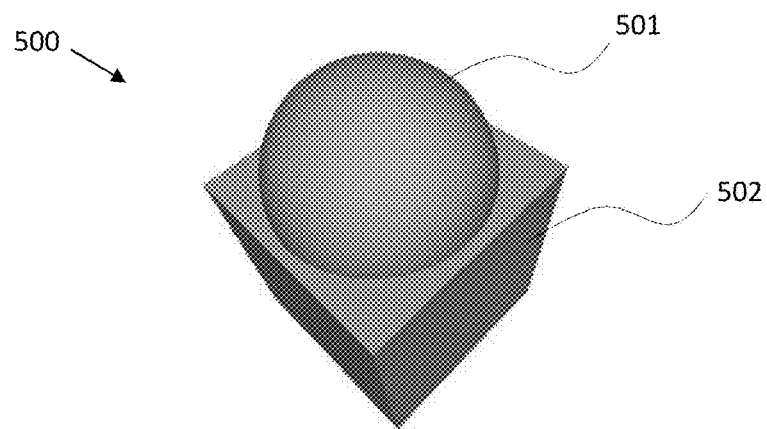
FIG. 5 shows partial dimensional change of the object in FIG. 3.

The computer system may be coupled to a display, such as a flat panel or touch panel display for displaying information to a computer user. One or more input devices are provided for communicating information and command selections to the processor. The display helps visualization of the CAD mode during design. An example of what is displayed to a designer is shown in FIGS. 3-5. The designer has control of what he/she wants to be displayed on a screen.

According to one embodiment, portions of the process may be performed by the computer system in response to the processor executing one or more sequences of one or more instructions contained in the memory. Such instructions may be read into the memory from another computer-readable medium, such as the storage device. Execution of the sequences of instructions contained in the memory causes the processor to perform the process steps described herein. One or more processors in a multi-processing arrangement may also be employed to execute the sequences of instructions contained in the memory. In alternative embodiments, hard-wired circuitry may be used in place of or in combination with software instructions. Various forms of computer readable media may be involved in carrying one or more sequences of one or more instructions to the processor for execution.

The descriptions above are intended to be illustrative, not limiting. Thus, it will be apparent to one skilled in the art that modifications may be made to the embodiments as described without departing from the scope of the disclosure.

The invention claimed is:

1. A method of improving reliability in designing an arbitrarily shaped object based on three-dimensional (3D) solid modeling of the object, the method comprising:
   obtaining a nominal model of the object;
   computing a surface mesh of the object;
   recording characteristics of a plurality of mesh nodes, including parametric coordinates and originating surfaces of each mesh node, and whether a particular mesh node lies on a surface boundary;
   obtaining a perturbed model of the object with at least one parameter of the object changed with respect to the nominal model;
   using the perturbed model, computing spatial positions of the plurality of mesh nodes by repeatedly querying corresponding spline surfaces of the perturbed model to obtain updated parametric coordinates of the plurality of mesh nodes;
   computing gradients at the plurality of mesh nodes by computing a vector at each mesh node that represents a difference between the previously recorded parametric coordinates of that mesh node and the updated parametric coordinates of that mesh node;
   reporting the computed gradients for the plurality of mesh nodes;
   detecting if any of the reported computed gradients is smaller than the rest of the computed gradients, indicating a spurious movement of the corresponding mesh node; and
   removing the computed gradients indicating spurious movement of certain mesh nodes among the plurality of mesh nodes to improve reliability of further design optimization of the object.

2. The method of claim 1, wherein the further design optimization of the object uses an adjoint-based optimization.

3. The method of claim 1, wherein the perturbed model is created using a 3D modeling kernel.

4. The method of claim 3, wherein the 3D modeling kernel is ACIS.

5. The method of claim 1, wherein the step of obtaining the perturbed model does not include importing the surface mesh of the object.

6. The method of claim 1, wherein the step of recording characteristics include: recording connectivity information for each of the plurality of mesh nodes with its neighboring mesh nodes.

7. The method of claim 6, wherein a data structure specifically designed to hold information about a mesh is used to record characteristics of the plurality of mesh nodes.

8. The method of claim 1, wherein the step of computing gradients include: for a mesh node that lies at a boundary or corner of two or more spline surfaces of the perturbed model:
   computing a separate gradient value corresponding to each spline surface of which the mesh node is a part of; and,
   using the mean of the computed separate gradient values as the gradient of the mesh node at the boundary or corner.

9. The method of claim 1, wherein a computed gradient being an order of magnitude smaller than a majority of the other computed gradients indicates a spurious movement of the corresponding mesh node.

10. The method of claim 1, wherein a user provides the at least one parameter that is different between the nominal model and the perturbed model.

11. The method of claim 1, wherein a user is notified if the perturbed model has different topology compared to the nominal model.

12. The method of claim 11, wherein the different topology includes a difference in a number of edges or surfaces of the object.

13. The method of claim 1, wherein the arbitrarily shaped object is fabricated based on an optimized design with improved reliability.

14. The method of claim 13, wherein the fabricated object has improved aerodynamic properties.

* * * * *